(12) United States Patent
Oyamada

(10) Patent No.: US 9,761,544 B1
(45) Date of Patent: Sep. 12, 2017

(54) SEMICONDUCTOR DEVICE

(71) Applicant: Noda Screen Co., Ltd., Aichi (JP)

(72) Inventor: Seisei Oyamada, Komaki (JP)

(73) Assignee: NODA SCREEN CO., LTD., Aichi (JP)

( * ) Notice: Subject to any disclaimer, the term of this patent is extended or adjusted under 35 U.S.C. 154(b) by 0 days.

(21) Appl. No.: 15/300,603

(22) PCT Filed: Nov. 13, 2015

(86) PCT No.: PCT/JP2015/082028
§ 371 (c)(1),
(2) Date: Sep. 29, 2016

(87) PCT Pub. No.: WO2017/081823
PCT Pub. Date: May 18, 2017

(51) Int. Cl.
*H01L 29/45* (2006.01)
*H01L 23/64* (2006.01)
(Continued)

(52) U.S. Cl.
CPC ............ *H01L 23/642* (2013.01); *H01G 4/33* (2013.01); *H01L 23/647* (2013.01); *H01L 24/06* (2013.01);
(Continued)

(58) Field of Classification Search
CPC .......... H01L 24/09; H01L 24/17; H01L 24/33
(Continued)

(56) References Cited

U.S. PATENT DOCUMENTS 6,181,015 B1 * 1/2001 Gotoh ................. H01L 23/3135
257/738
8,203,198 B2 6/2012 Shioga et al.
(Continued)

FOREIGN PATENT DOCUMENTS

JP 2001-15654 1/2001
JP 2007-80946 3/2007
(Continued)

OTHER PUBLICATIONS

Written Opinion of the International Searching Authority dated Jan. 26, 2016 in International (PCT) Application No. PCT/JP2015/082028, with English translation.

*Primary Examiner* — George Fourson, III
(74) *Attorney, Agent, or Firm* — Wenderoth, Lind & Ponack, L.L.P.

(57) ABSTRACT

A semiconductor device is provided with: a semiconductor integrated circuit having a bump mounting surface; and a thin-film capacitor portion connected to the bump mounting surface via a bump. The semiconductor integrated circuit includes a first power supply pad, and a second power supply pad. The thin-film capacitor portion includes a first electrode layer connected to the first power supply pad, a second electrode layer connected to the second power supply pad, and a dielectric layer formed between the first electrode layer and the second electrode layer. The semiconductor device is provided with an electric power supply path configured to supply electric power to the semiconductor integrated circuit, and a thin plate-shaped metal resistor portion provided in the electric power supply path and made from a metal based high-resistance material having a volume resistivity higher than a volume resistivity of the first electrode layer and the second electrode layer.

12 Claims, 19 Drawing Sheets

(51) Int. Cl.
*H01L 23/00* (2006.01)
*H01G 4/33* (2006.01)

(52) U.S. Cl.
CPC .............. *H01L 24/13* (2013.01); *H01L 24/16* (2013.01); *H01L 24/09* (2013.01); *H01L 24/17* (2013.01); *H01L 24/33* (2013.01); *H01L 2224/0401* (2013.01); *H01L 2224/16265* (2013.01); *H01L 2924/14* (2013.01); *H01L 2924/19041* (2013.01); *H01L 2924/19043* (2013.01); *H01L 2924/19103* (2013.01)

(58) Field of Classification Search
USPC ........................................................ 257/737
See application file for complete search history.

(56) References Cited

U.S. PATENT DOCUMENTS

| | | | |
|---|---|---|---|
| 9,345,126 B2 | 5/2016 | Hoshi et al. | |
| 2002/0041037 A1* | 4/2002 | Kobayashi | H01L 23/3128 257/778 |
| 2004/0239349 A1* | 12/2004 | Yamagishi | G01R 1/07378 324/754.07 |
| 2005/0139988 A1* | 6/2005 | Ishida | H01L 23/49816 257/700 |
| 2007/0205486 A1 | 9/2007 | Shioga et al. | |
| 2008/0258259 A1* | 10/2008 | Osaka | H01L 23/481 257/532 |
| 2008/0266031 A1* | 10/2008 | Uematsu | H01L 23/49838 333/247 |
| 2009/0223705 A1* | 9/2009 | Yamashita | B30B 5/02 174/260 |
| 2011/0042808 A1* | 2/2011 | Kumazawa | H01L 24/03 |
| 2014/0210076 A1* | 7/2014 | Aliane | H01L 23/49811 257/737 |
| 2014/0268586 A1 | 9/2014 | Hoshi et al. | |
| 2017/0125332 A1* | 5/2017 | Song | H01L 23/49838 |

FOREIGN PATENT DOCUMENTS

| | | |
|---|---|---|
| JP | 2007-234843 | 9/2007 |
| JP | 2008-270369 | 11/2008 |
| JP | 2010-283130 | 12/2010 |
| JP | 2014-175628 | 9/2014 |

* cited by examiner

FIRST LAYER

SECOND LAYER

THIRD LAYER

FOURTH LAYER

FIFTH LAYER

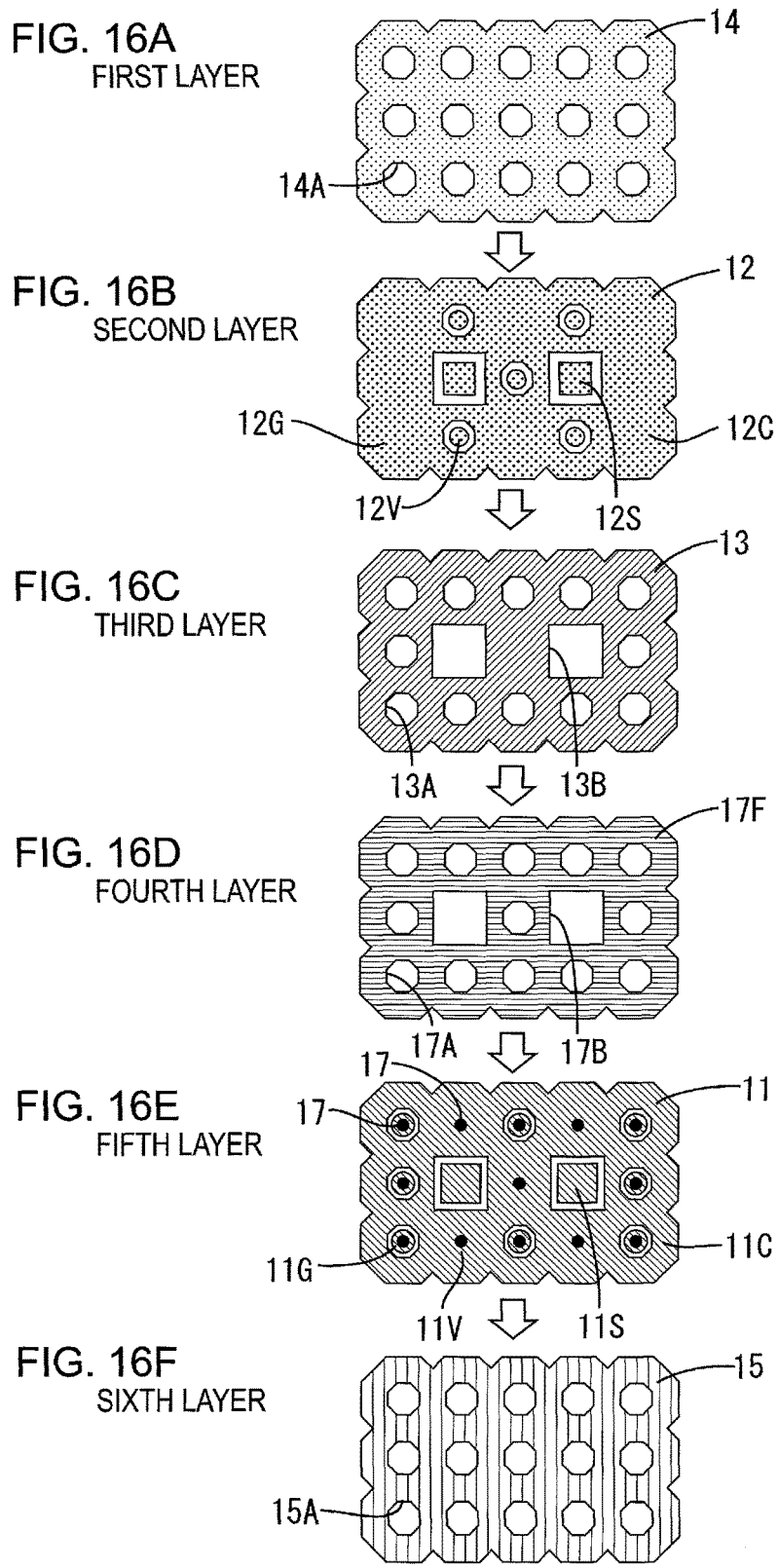

SEMICONDUCTOR DEVICE

TECHNICAL FIELD

The present invention relates to a semiconductor device, and more particularly to a technology for decreasing, in a semiconductor device equipped with a semiconductor integrated circuit, power supply impedance with respect to the semiconductor integrated circuit.

BACKGROUND ART

Conventionally, in a semiconductor device equipped with a semiconductor integrated circuit, a technology disclosed in Patent Document 1 is known, for example, as a technology for decreasing power supply impedance with respect to the semiconductor integrated circuit. According to the technology disclosed in Patent Document 1, the antiresonance impedance of power supply impedance is decreased by configuring a series resonance circuit from a pattern unit including three conductor patterns between a power supply terminal and a ground terminal of a semiconductor element (semiconductor integrated circuit).

Patent Document 1: Japanese Patent Application Laid-Open No. 2014-175628

DISCLOSURE OF THE PRESENT INVENTION

Problem to be Solved by the Invention

While according to the technology disclosed in Patent Document 1, the antiresonance impedance of power supply impedance can be decreased, the series resonance circuit includes linear conductor patterns for forming an inductance component. Such linear conductor patterns may possibly constitute a noise emitting source at the time of high speed operation of the semiconductor integrated circuit where harmonic components included in the operation frequency exceed 1 GHz, and may prove disadvantageous in terms of noise suppression. Accordingly, a technology for decreasing power supply impedance while suppressing the generation of noise at the time of high speed operation is desired.

Accordingly, in the present description, there is provided a semiconductor device in which power supply impedance is decreased while the generation of noise at the time of high speed operation is suppressed.

Means for Solving the Problem

A semiconductor device disclosed by the present description includes a semiconductor integrated circuit having a bump mounting surface; and a thin-film capacitor portion connected to the bump mounting surface via a bump. The semiconductor integrated circuit includes a first power supply pad formed on the bump mounting surface and to which a power supply voltage of one polarity is applied, and a second power supply pad formed on the bump mounting surface and to which a power supply voltage of another polarity is applied. The thin-film capacitor portion includes a first electrode layer connected to the first power supply pad via the bump, a second electrode layer connected to the second power supply pad via the bump, and a dielectric layer formed between the first electrode layer and the second electrode layer. The semiconductor device includes: an electric power supply path including the first and second power supply pads, the bump, and the thin-film capacitor portion, and configured to supply electric power to the semiconductor integrated circuit; and a thin plate-shaped metal resistor portion provided in the electric power supply path and made from a metal based high-resistance material having a volume resistivity higher than a volume resistivity of the first electrode layer and the second electrode layer.

According to the present configuration, in the electric power supply path including the first and second power supply pads, the bump, and the thin-film capacitor portion, there may be provided the thin plate-shaped metal resistor portion made from the metal based high-resistance material having a volume resistivity higher than a volume resistivity of the first electrode layer and the second electrode layer. That is, the metal resistor portion is connected in series with the electric power supply path. It has been confirmed through a simulation that by adjusting the resistance value of the metal resistor portion, the antiresonance impedance of the power supply impedance of the semiconductor integrated circuit can be decreased; that is to say that the power supply impedance can be decreased. In addition, the metal resistor portion, because of its thin-plate shape, does not readily constitute a noise emitting source at the time of high speed operation of the semiconductor integrated circuit. Accordingly, the present configuration can decrease the power supply impedance while suppressing the generation of noise at the time of high speed operation. The metal based high-resistance material may include metal simple substance, a metal compound, a metal oxide, and the like.

In the semiconductor device, the electric power supply path may include the first and second power supply pads, the bump, and the thin-film capacitor portion. The metal resistor portion may be provided between the bump mounting surface of the semiconductor integrated circuit and the thin-film capacitor portion.

According to the present configuration, the electric power supply path can be formed so as to be short, and the connection wiring for the metal resistor portion can be minimized in length. Accordingly, the generation of parasitic inductance and the like associated with the connection wiring for the metal resistor portion can be suppressed.

In the foregoing, the first electrode layer may include a first supply portion constituting the electric power supply path and electrically connected to the bump. The second electrode layer may include a second supply portion constituting the electric power supply path and electrically connected to the bump. The metal resistor portion may be provided at least one of between the bump and the first supply portion, and between the bump and the second supply portion.

In this case, the metal resistor portion can be formed, as a pad portion of the bump connecting the thin-film capacitor portion and the semiconductor integrated circuit, on the first supply portion of the first electrode layer of the thin-film capacitor portion or on the second supply portion of the second electrode layer, using a thin-film formation technology, such as sputtering. Accordingly, the formation of the metal resistor portion can be performed using a similar method to the method for forming the thin-film capacitor portion. That is, the formation of the metal resistor portion can be performed easily.

In the foregoing, alternatively, the metal resistor portion may be provided at the first power supply pad and the second power supply pad.

In this case, the metal resistor portion is provided on the semiconductor integrated circuit side. In this configuration, also, the power supply impedance can be decreased while suppressing the generation of noise at the time of high speed operation.

The semiconductor device may further include an external connection portion electrically connecting, on an opposite side from the semiconductor integrated circuit, the thin-film capacitor portion to an outside. The electric power supply path may include the first and second power supply pads, the bump, the thin-film capacitor portion, and the external connection portion. The metal resistor portion may be provided between the external connection portion and the thin-film capacitor portion.

In the present configuration, also, the electric power supply path can be formed so as to be short, and the connection wiring for the metal resistor portion can be made short. Accordingly, the generation of parasitic inductance and the like associated with the connection wiring for the metal resistor portion can be suppressed.

In the foregoing, the first electrode layer may include a first supply portion constituting the electric power supply path and electrically connected to the bump. The second electrode layer may include a second supply portion constituting the electric power supply path and electrically connected to the bump. The metal resistor portion may be provided at least one of between the external connection portion and the first supply portion, and between the external connection portion and the second supply portion.

In this case, also, the metal resistor portion can be formed on the first supply portion of the first electrode layer of the thin-film capacitor portion or on the second supply portion of the second electrode layer, using a thin-film formation technology, such as sputtering. It has also been confirmed through a simulation that the power supply impedance can be decreased.

In the semiconductor device, the thin-film capacitor portion may include a metal resistor layer formed between the first electrode layer and the dielectric layer, or between the second electrode layer and the dielectric layer, and made from a metal based high-resistance material having a volume resistivity higher than a volume resistivity of the first electrode layer and the second electrode layer.

According to the present configuration, it can be said that, due to the metal resistor layer, the resistor connected in series with the thin-film capacitor can be formed without connection wiring. It has been confirmed that by adding the metal resistor layer to the metal resistor portion formed in the electric power supply path, the power supply impedance decreasing effect by the metal resistor portion alone is reinforced. In addition, the resistor connected in series with the thin-film capacitor can be formed using the thin-film formation technology for forming the thin-film capacitor, such as sputtering.

In the semiconductor device, the metal resistor portion and the metal resistor layer may have a volume resistivity of not smaller than 70 μΩ cm.

It has been confirmed through a simulation that, according to the present configuration, the power supply impedance can be decreased reliably.

In the semiconductor device, the thin-film capacitor may have a planar shape equal to a planar shape of the semiconductor integrated circuit.

According to the present configuration, the capacitance of the thin-film capacitor can be maximized while the planar shape size of the semiconductor device is equal to the planar shape of the semiconductor integrated circuit.

The semiconductor device may be further provided with a multilayer ceramic capacitor connected in parallel with the thin-film capacitor.

According to the present configuration, the generation of noise at the time of high speed operation can be further suppressed by the multilayer ceramic capacitor (MLCC) provided as a bypass capacitor.

A semiconductor device disclosed by the present description includes a semiconductor integrated circuit having a bump mounting surface; and a thin-film capacitor portion connected to the bump mounting surface via a bump. The semiconductor integrated circuit includes a first power supply pad formed on the bump mounting surface and to which a power supply voltage of one polarity is applied, and a second power supply pad formed on the bump mounting surface and to which a power supply voltage of another polarity is applied. The thin-film capacitor portion includes a first electrode layer connected to the first power supply pad via the bump, a second electrode layer connected to the second power supply pad via the bump, a dielectric layer formed between the first electrode layer and the second electrode layer, and a metal resistor layer formed between the first electrode layer and the dielectric layer or between the second electrode layer and the dielectric layer, and made from a metal based high-resistance material having a volume resistivity higher than a volume resistivity of the first electrode layer and the second electrode layer.

According to the present configuration, it can be said that due to the metal resistor layer, the resistor connected in series with the thin-film capacitor can be formed without connection wiring. It has been confirmed that the metal resistor layer decreases the power supply impedance. In addition, the resistor connected in series with the thin-film capacitor can be formed using the thin-film formation technology for forming the thin-film capacitor, such as sputtering.

Advantageous Effect of the Invention

According to the present invention, power supply impedance can be decreased while the generation of noise at the time of high speed operation is suppressed.

BRIEF DESCRIPTION OF THE DRAWINGS

FIGS. 16A to 16F are schematic diagrams describing a method for fabricating a thin-film capacitor portion according to the third embodiment;

BEST MODE FOR CARRYING OUT THE INVENTION

First Embodiment

Figure 1:
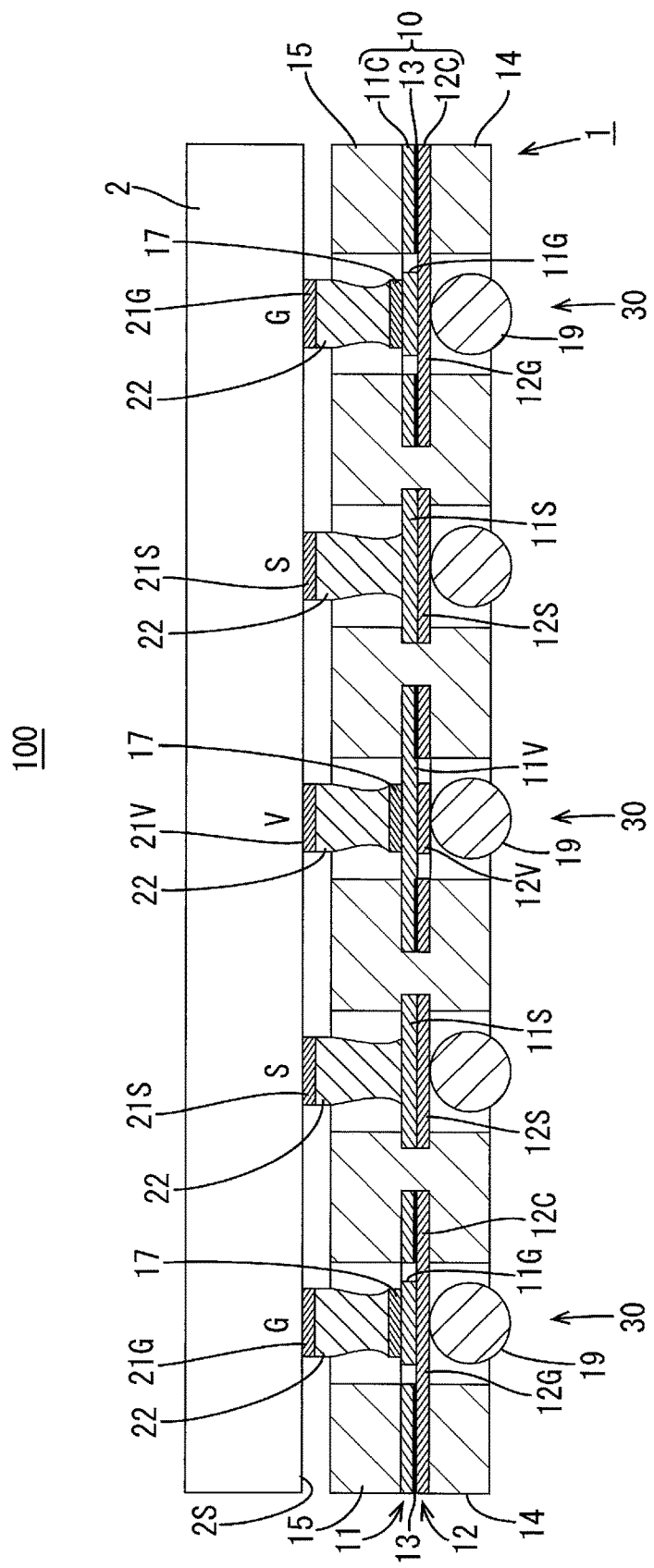
FIG. 1 is a schematic cross sectional view of a semiconductor device according to a first embodiment.

A first embodiment will be described with reference to FIG. 1 to FIG. 9, in which like reference symbols designate like or corresponding parts throughout the drawings. Designation of similar components with reference numerals may be omitted.

1. Configuration of Semiconductor Device

As illustrated in FIG. 1, a semiconductor device 100 generally includes a thin-film capacitor portion 1, an LSI chip (an example of "semiconductor integrated circuit") 2, and electric power supply paths 30. The LSI is a CPU or MPU, for example.

Figure 9:
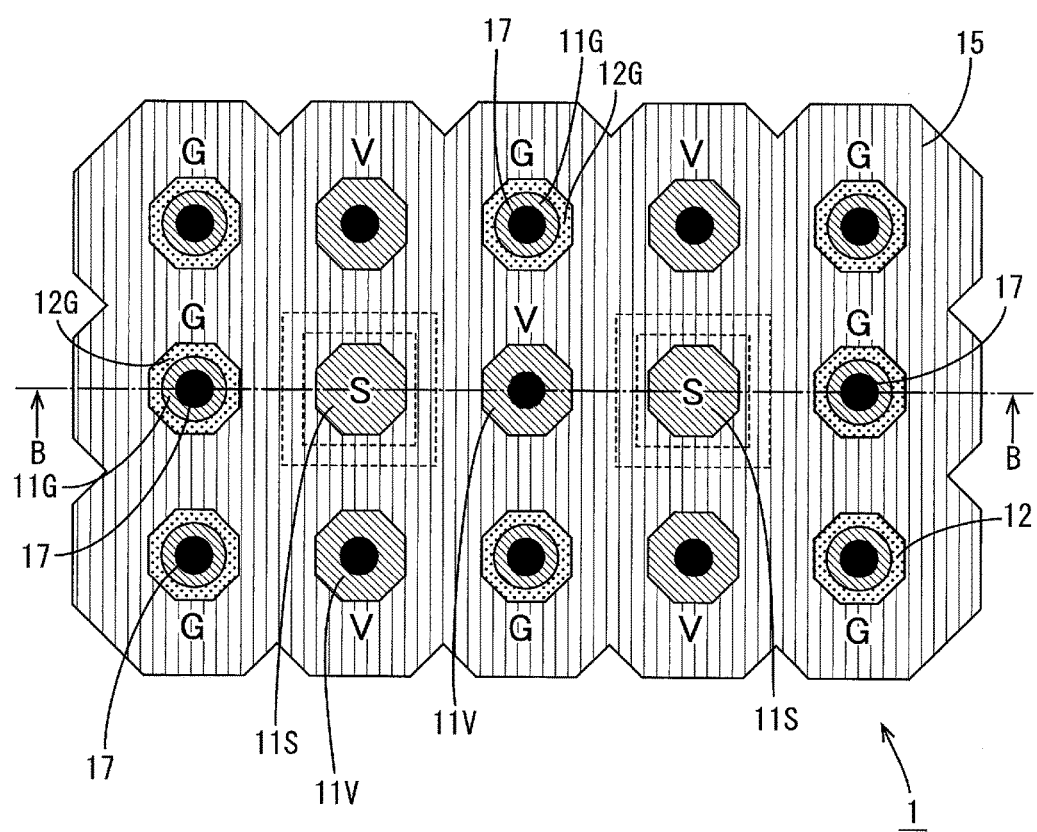
FIG. 9 is a plan view of the thin-film capacitor portion.

FIG. 1 is a cross sectional view of the semiconductor device 100 corresponding to the position indicated by a dot-and-dash line B-B in FIG. 9. In the following, letter "V" suffixed to reference numerals means that the designated member and the like pertain to a positive power supply voltage (an example of "power supply voltage of one polarity") applied to the LSI chip 2; letter "G" means that the designated member and the like pertain to a ground voltage that is a negative power supply voltage (an example of "power supply voltage of another polarity") applied to the LSI chip 2. Letter "S" indicates a member and the like pertaining to signals input to or output from the LSI chip 2.

The LSI chip 2 according to the present embodiment is an area array type LSI (see FIG. 9) and, as illustrated in FIG. 1, includes a bump mounting surface 2S. On the bump mounting surface 2S, a plurality of electrode pads 21 is formed. The electrode pads 21 include power supply pads for power supply voltage (an example of "first power supply pads") 21V; ground pads for ground voltage (an example of "second power supply pads") 21G; and signal pads 21S. On each of the electrode pads 21, a bump 22 for connecting the LSI chip 2 and the thin-film capacitor portion 1 is formed. The bumps 22 according to the present embodiment are gold (Au) stud bumps, for example.

The thin-film capacitor portion 1, as illustrated in FIG. 1, includes a thin-film capacitor 10; organic insulating layers 14, 15; and metal resistor portions 17.

The thin-film capacitor portion 1 includes a first electrode layer 11 connected to the power supply pads 21V via the bumps 22; a second electrode layer 12 connected to the ground pads 21G via the bumps 22; and a dielectric layer 13 formed between the first electrode layer 11 and the second electrode layer 12. The first electrode layer 11 and the second electrode layer 12 are made of a copper (Cu) thin-film, for example. The dielectric layer 13 is made of a strontium titanate (STO) film, for example.

The first electrode layer 11 includes a first electrode portion 11C constituting one electrode of the thin-film capacitor 10, and first supply portions (11G, 11V) constituting the electric power supply paths 30. The second electrode layer 12 includes a second electrode portion 12C constituting the other electrode of the thin-film capacitor 10, and second supply portions (12G, 12V) constituting the electric power supply paths 30. The thin-film capacitor 10 includes the first electrode portion 11C, the second electrode layer 12, and the second electrode portion 12C.

The thin-film capacitor portion 1 has a planar shape equal to a planar shape of the LSI chip 2. In other words, the planar shape of the thin-film capacitor 10 is equal to the planar shape of the LSI chip 2. Accordingly, the capacitance of the thin-film capacitor 10 can be maximized while the planar shape size of the semiconductor device 100 is equal to the planar shape of the LSI chip 2.

According to the first embodiment, the metal resistor portions 17 are provided on the first supply portions (11G, 11V) of the first electrode layer 11, as illustrated in FIG. 1. That is, according to the first embodiment, the metal resistor portions 17 are provided between the bump mounting surface 2S of the LSI chip 2 and the thin-film capacitor portion 1.

Figure 2:
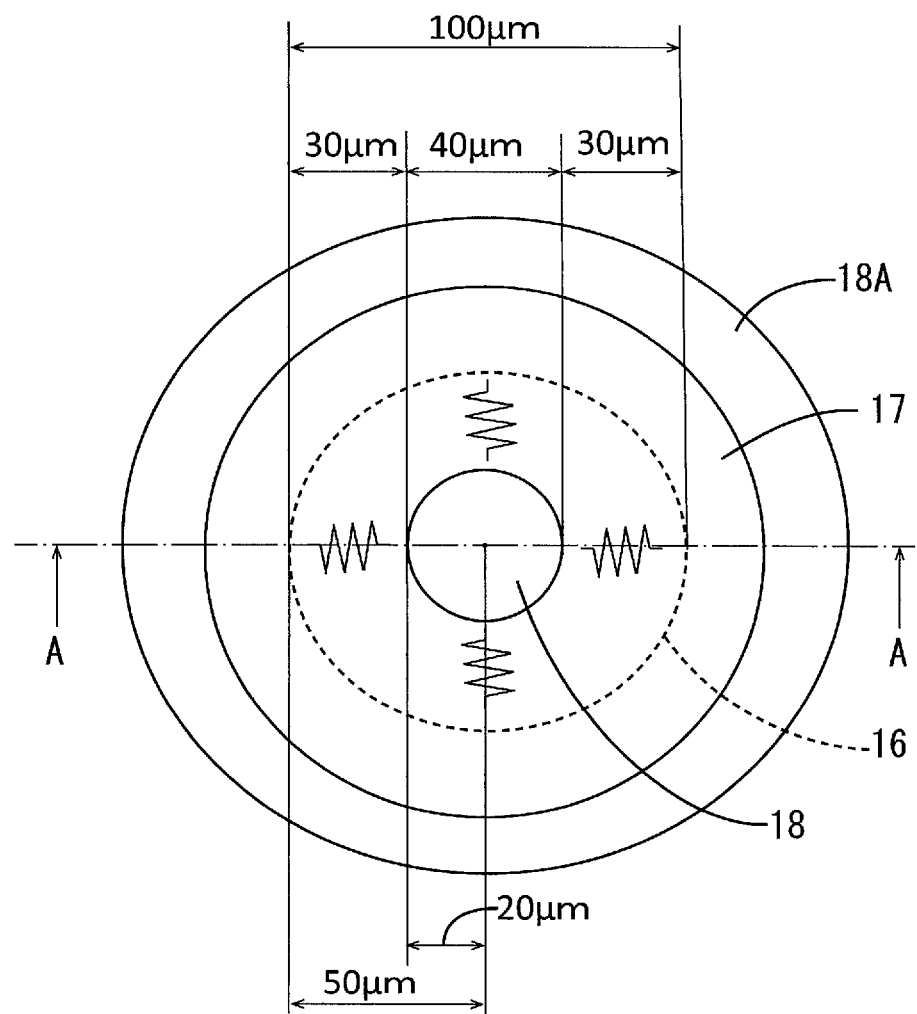
FIG. 2 is a schematic perspective view of a metal resistor portion.
Figure 3:
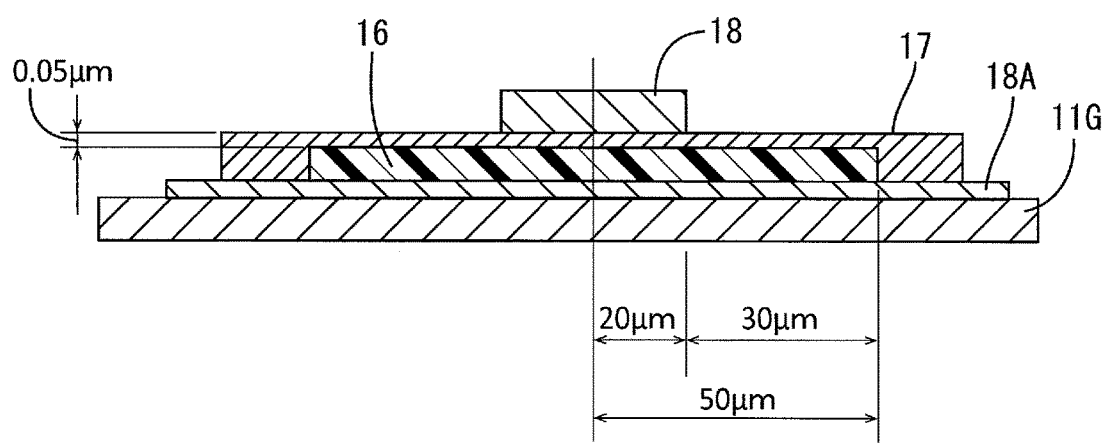
FIG. 3 is a schematic cross sectional view taken along line A-A of FIG. 2.

The metal resistor portions 17 are made from a metal based high-resistance material and have a thin-plate shape. In the first embodiment, specifically, as illustrated in FIG. 2 and FIG. 3, the metal resistor portions 17 are made of an annular metal thin plate. The metal resistor portions 17 are made from a metal based high-resistance material with a volume resistivity higher than the volume resistivity of the first electrode layer 11 and the second electrode layer 12. For example, the metal resistor portions 17 are made from tantalum nitride (TaN).

Specifically, the metal resistor portion 17, as illustrated in FIG. 2 and FIG. 3, have a thickness of 0.05 micrometers (μm), for example, and corresponds to a region (annular region) between a circle with a diameter of 20 μm and a circle with a diameter of 50 μm. If the volume resistivity of TaN is 135 μΩ·cm, the annular metal resistor portion 17 has a resistance value of approximately 1.4 ohms (Ω).

In this case, the upper surface of the metal resistor portion 17 (bumps 22 connecting surface), as illustrated in FIG. 2, is flash-coated with a film 18 of highly conductive metal (such as Au or Pt) having a diameter of 40 μm and a film thickness on the order of 0.1 μm, for example. The upper surface of the first supply portion 11G of the first electrode layer 11 is also flash-coated with a conductive film 18A of Au, for example, having a diameter of 40 μm and a film thickness on the order of 0.1 μm, for example. The resistance value of the metal resistor portion 17 can be controlled depending on the material, film thickness, and the like of the metal films 18, 18A.

On the conductive film 18A, there is formed an insulating film 16 (for example, an organic insulating film of polyimide, bismaleimide-triazine (BT) resin, or Ajinomoto Build-up Film (ABF)) having a diameter of 50 μm and a film thickness on the order of 15 μm. On the conductive film 18A and the insulating film 16, the metal resistor portions 17 are formed by sputtering TaN. In this case, the TaN on the insulating film 16 corresponds to the metal resistor portions 17, of which the thickness is 0.05 µm, for example.

The metal based high-resistance material of the metal resistor portions 17 is not limited to TaN, and may preferably be a material with a volume resistivity of not less than 70 µΩ·cm. Examples of the metal based high-resistance material include nichrome (NiCr), SUS304 (stainless steel), CuMn7Sn (copper manganese tin), NCF800 (stainless steel), and bismuth (Bi). The thin-plate shape of the metal resistor portions 17 is not limited to the annular shape, as illustrated in FIG. 2.

Figure 4:
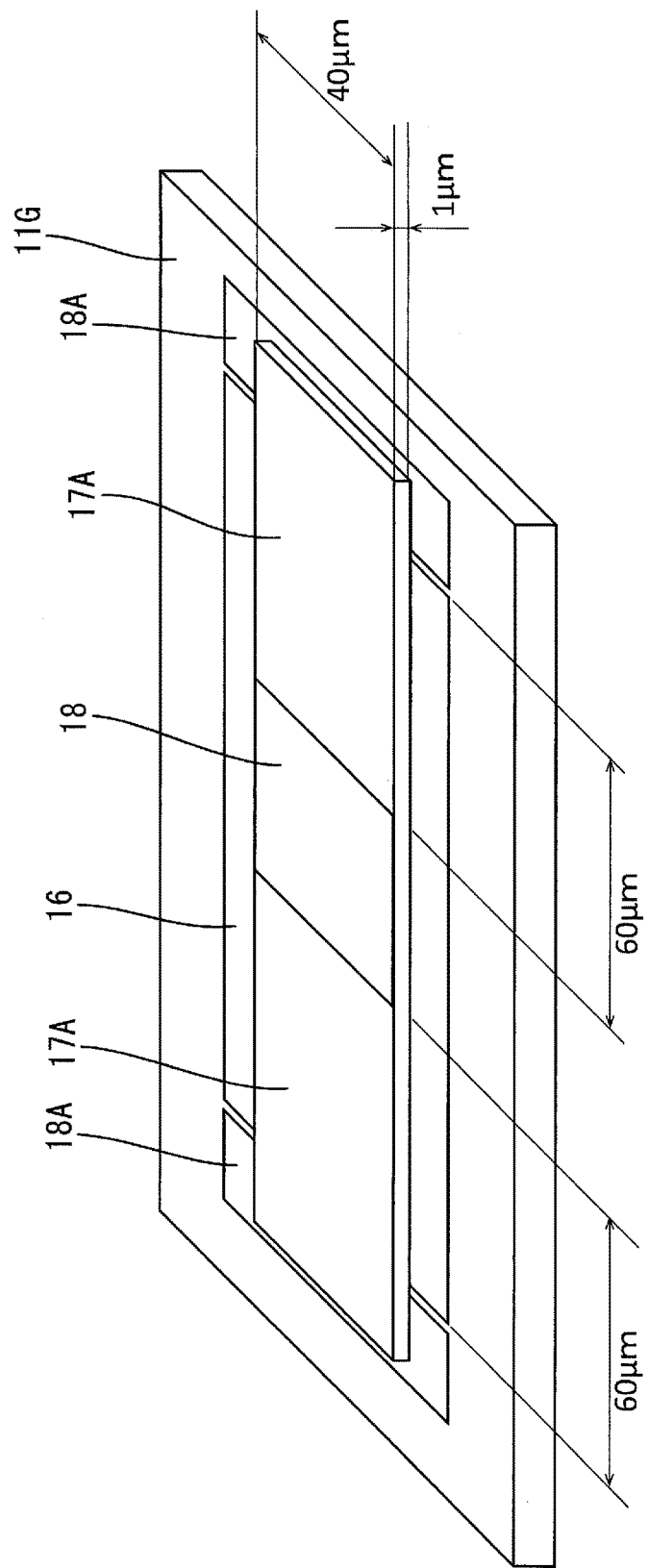
FIG. 4 is a schematic perspective view of another metal resistor portion.

For example, as illustrated in FIG. 4, the shape of the metal resistor portions 17 may be rectangular as viewed in plan. In this case, also, the metal resistor portions 17 are formed on the conductive film 18A and the insulating film 16 by sputtering TaN, for example, where the TaN on the insulating film 16 corresponds to the metal resistor portions 17A. In this case, as illustrated in FIG. 4, the metal resistor portions 17 have the shape of a thin plate with a thickness of 1.0 µm, a width of 40 µm, and a length of 60 µm. When the metal based high-resistance material is TaN as in this case, the metal resistor portions 17A have a resistance value of approximately 2.0Ω (ohms). In the example of FIG. 4, two metal resistor portions 17A are connected in parallel, so that the resistance value of the metal resistor portion in the example of FIG. 4 is approximately 1.0Ω (ohms).

To the second electrode layer 12 of the thin-film capacitor portion 1, external connection bumps 19 are connected for connecting the thin-film capacitor portion 1 to an external board 4, such as a motherboard. The external connection bumps 19 are solder micro bumps, or Au stud bumps, for example.

The electric power supply paths 30 include the power supply pads 21V, the ground pads 21G, the bumps 22, the first supply portions (11G, 11V) and the second supply portions (12G, 12V) of the thin-film capacitor portion 1, and the external connection bumps 19.

2. Simulation of Power Supply Impedance

Figure 5:
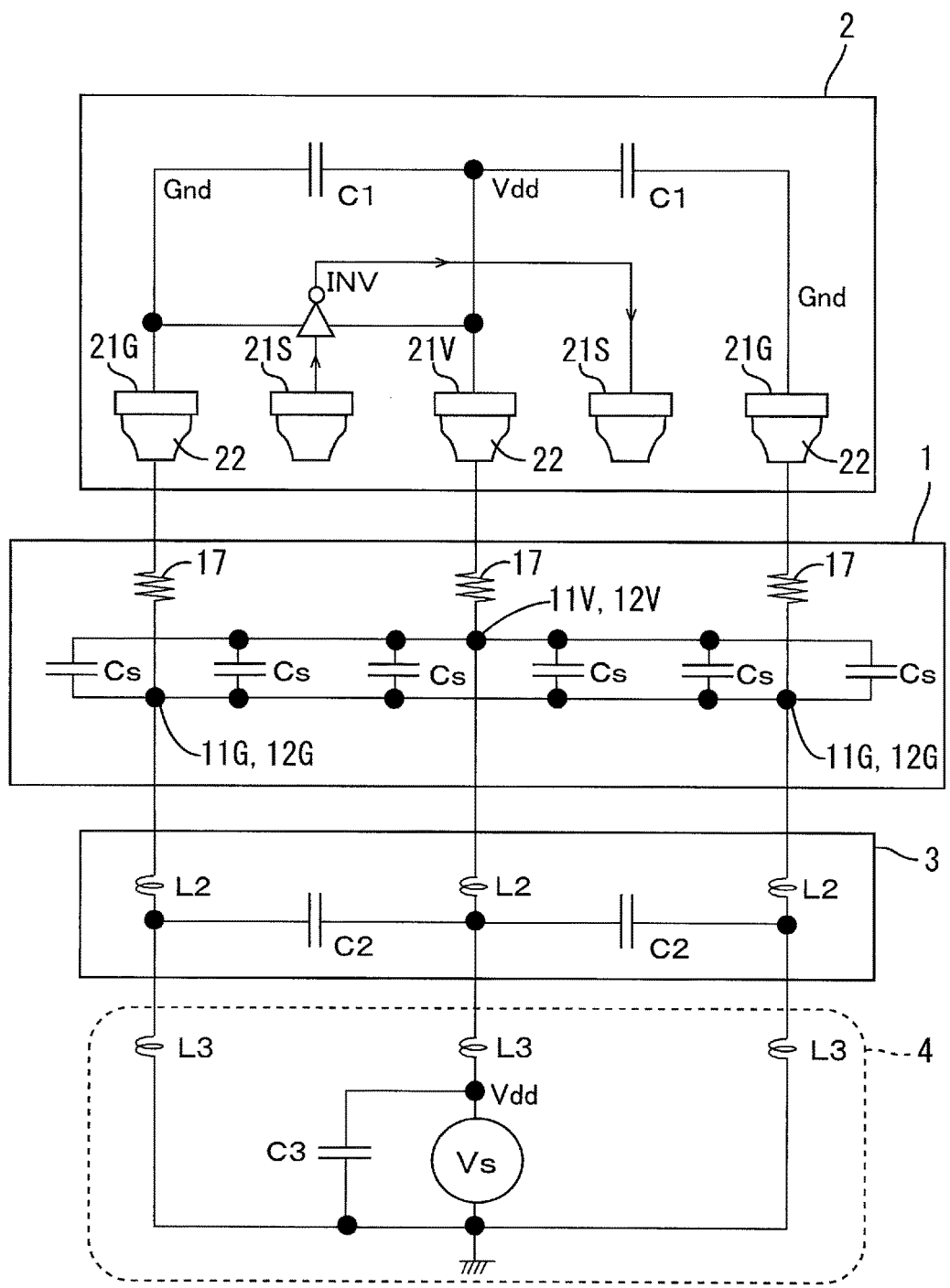
FIG. 5 is a schematic equivalent circuit diagram of a power supply system for the semiconductor device according to the first embodiment.

FIG. 5 is a schematic equivalent circuit diagram of power supply impedance (impedance on the electric power supply side as seen from the LSI chip 2) Zs of the LSI chip 2. In the LSI chip 2, parasitic capacitances C1 are present between power supply voltage Vdd and ground Gnd.

The thin-film capacitor 10 of the thin-film capacitor portion 1 is described as distributed capacitances Cs. In a package 3 of the semiconductor device 100, parasitic capacitances C2 are present between the power supply voltage Vdd and ground Gnd. In power supply lines and ground lines, parasitic inductances L2 are present. The parasitic capacitances C2 include a bypass capacitor and the like.

In a power supply board (such as a motherboard) 4 including a power supply Vs that supplies electric power to the semiconductor device 100, a smoothing capacitor C3 and parasitic inductances L3 are present.

Figure 6A:
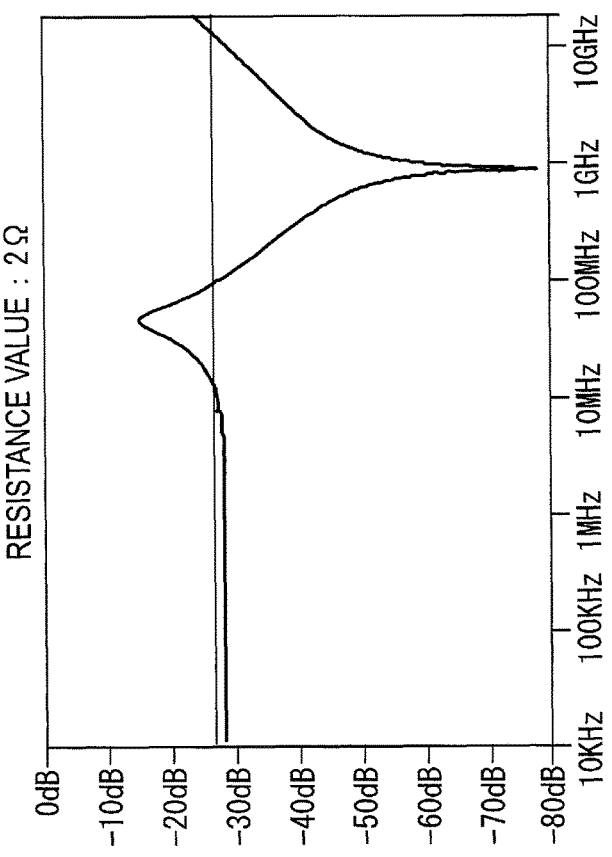
FIGS. 6A and 6B are graphs of power supply impedance characteristics depending on the resistance value of the metal resistor portion.
Figure 6B:
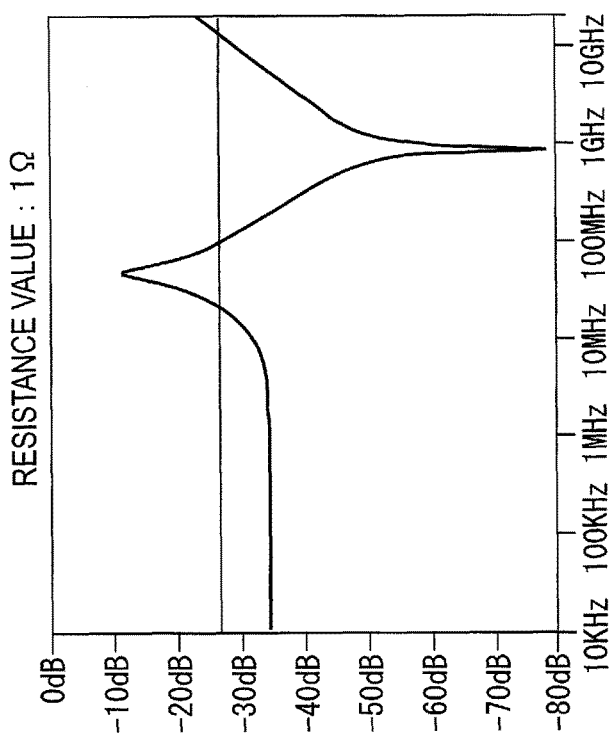

On the basis of such equivalent circuit, FIGS. 6A and 6B illustrate the results of simulation of the power supply impedance Zs of the LSI chip 2. FIG. 6A illustrates the case where the resistance value due to the metal resistor portions 17 and the like is assumed to be 1Ω. FIG. 6B illustrates the case where the resistance value is assumed to be 2Ω. In FIG. 6, the vertical axis shows the S parameter, and the linear level indicated at around −28 dB corresponds to the power supply impedance Zs of approximately 1Ω.

Figure 7:
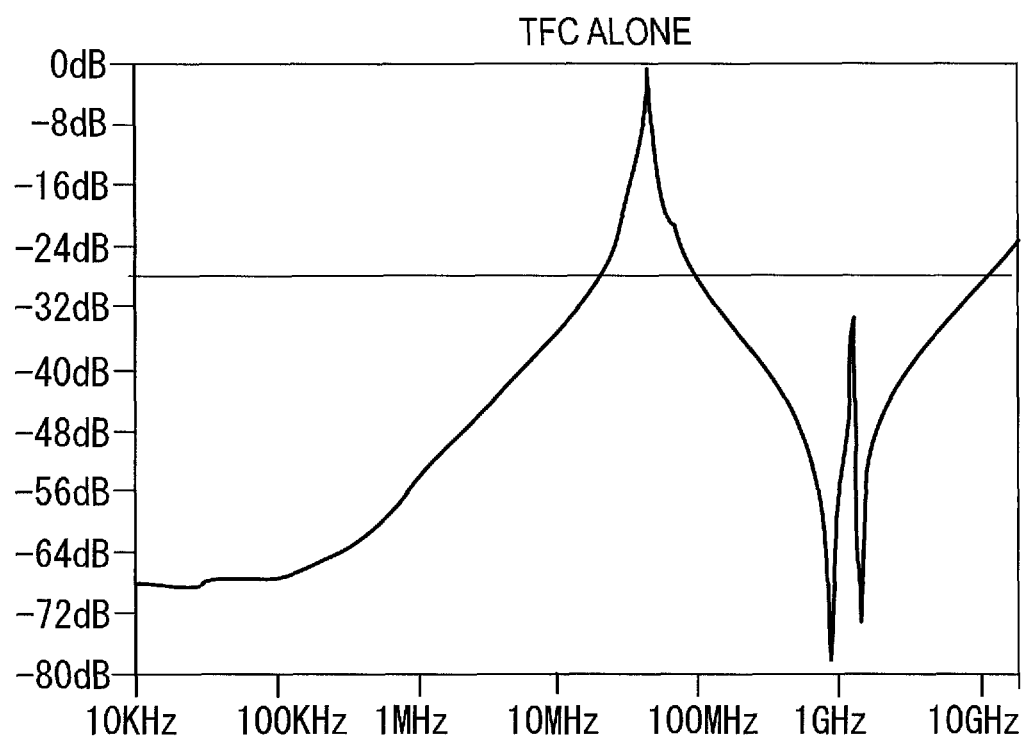
FIG. 7 is a graph of power supply impedance characteristics in the absence of the metal resistor portion.

FIG. 7 illustrates the results of simulation of the power supply impedance Zs in the case of only the thin-film capacitor (TFC) 10 without the metal resistor portions 17. Compared with FIG. 7, when the metal resistor portions 17 are provided, the peak of an antiresonance point exhibited at around 60 MHz is lowered as the resistance value of the metal resistor portions 17 increases, and, correspondingly, the power supply impedance Zs at 10 MHz or below increases. In addition, the antiresonance caused at around 1.3 GHz in FIG. 7 is suppressed. Also, in a high-frequency region of 10 GHz or above, the region in which the power supply impedance Zs is not more than 1Ω is extended. It has been learned from the simulation results that, in the configuration of the first embodiment, in order to decrease the power supply impedance Zs (for example, 1Ω or below) in the entire frequency bandwidth, and to lower the peak of the antiresonance point, the resistance value of the metal resistor portions 17 may be adjusted between 1Ω and 2Ω.

3. Method for Fabricating Thin-Film Capacitor Portion

With reference to FIG. 8, a method for fabricating the thin-film capacitor portion 1 will be described. First, an organic insulating film 14 is formed as a first layer (see FIG. 8A). In the organic insulating film 14, through holes 14A are formed at positions corresponding to the electrode pads 21 of the area array type LSI chip 2. The organic insulating film 14 is made from BT resin or ABF, for example.

Figure 8A:
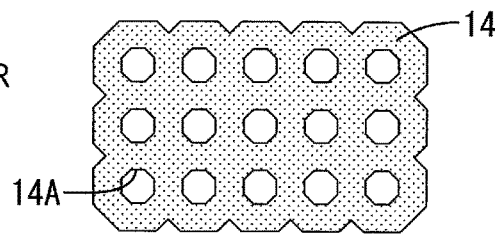
FIGS. 8A to 8E are schematic diagrams describing a method for fabricating a thin-film capacitor portion.
Figure 8B:
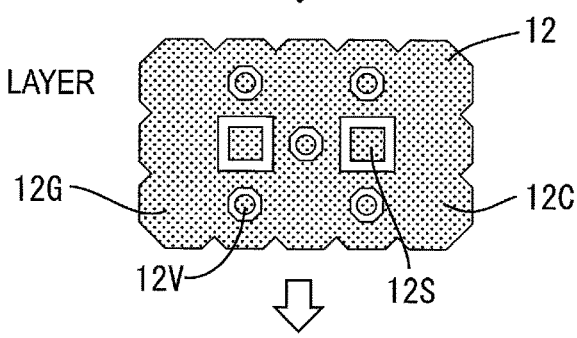

Then, on the organic insulating film 14, the second electrode layer 12 is formed, as a second layer, from a Cu thin-film by CVD, for example (see FIG. 8B). In the second electrode layer 12, there are formed the second supply portions (power supply voltage islands) 12V at positions corresponding to the power supply pads 21V of the LSI chip 2, and the signal islands 12S, which are rectangular in plan, at positions corresponding to the signal pads 21S. The positions of the second electrode layer 12 corresponding to the ground pads 21G of the LSI chip 2 correspond to the second supply portions 12G.

Figure 8C:
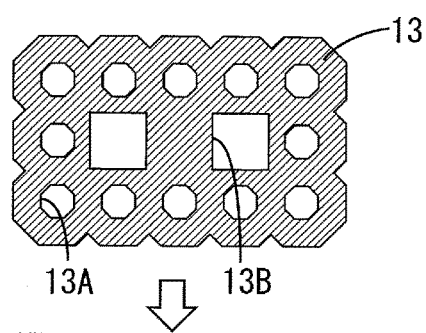

Then, on the second electrode layer 12, the dielectric layer 13 is formed, as a third layer, from a STO (SrTio3) thin-film by sputtering, for example (see FIG. 8C). In the dielectric layer 13, at positions corresponding to the electrode pads 21 of the LSI chip 2, through holes 13A are formed. At positions corresponding to the signal pads 21S, through holes 13B having a rectangular cross section are formed. The dielectric layer 13 has a thickness of 0.4 µm, for example.

Figure 8D:
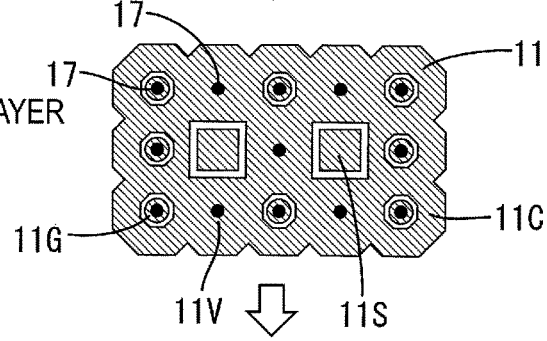

Then, on the dielectric layer 13, the first electrode layer 11 is formed, as a fourth layer, from a Cu thin-film by sputtering, for example (see FIG. 8D). In the first electrode layer 11, the first supply portions (ground islands) 11G are formed at positions corresponding to the ground pads 21G of the LSI chip 2, and the signal islands 11S having a rectangular planar shape are formed at positions corresponding to the signal pads 21S. The positions of the first electrode layer 11 corresponding to the power supply pads 21V of the LSI chip 2 correspond to the first supply portions 11V. On the first supply portions 11G, 11V, the metal resistor portions 17 illustrated in FIG. 2 are formed by sputtering or the like.

Figure 8E:
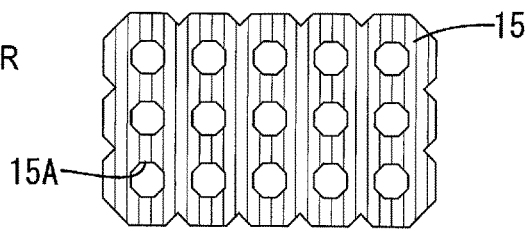

Then, on the first electrode layer 11, the organic insulating film 15 similar to the organic insulating film 14 of the first layer is fabricated as a fifth layer (see FIG. 8E). In the organic insulating film 15, the through holes 15A having a hexagonal cross section are formed at positions corresponding to the electrode pads 21 of the LSI chip 2. In this way, the thin-film capacitor portion 1 as illustrated in the plan view of FIG. 9 is formed.

4. Effects of First Embodiment

In the electric power supply paths 30 including the power supply pads 21V, the ground pads 21G, the bumps 22, and the thin-film capacitor portion 1, there are provided the thin annular metal resistor portions 17 made from NiCr (metal based high-resistance material with a volume resistivity of not smaller than 70 μΩ·cm), for example. That is, the metal resistor portions 17 are connected in series with the electric power supply paths 30.

It has been confirmed through the simulation that, by adjusting the resistance value of the metal resistor portions 17, the antiresonance impedance of the power supply impedance Zs of the semiconductor integrated circuit 2 can be decreased; that is to say that the power supply impedance Zs can be decreased. The metal resistor portions 17, because of their thin annular (thin plate-like) shape, do not readily constitute a noise emitting source at the time of high speed operation of the semiconductor integrated circuit 2. Accordingly, in the present configuration, the power supply impedance Zs can be decreased while suppressing the generation of noise at the time of high speed operation.

The metal resistor portions 17 are provided between the bump mounting surface 2S of the LSI chip 2 and the thin-film capacitor portion 1, or, specifically, between the bumps 22 and the first supply portions (11G, 11V) of the first electrode layer 11. Accordingly, the electric power supply paths 30 can be formed so as to be short, and the connection wiring for the metal resistor portions 17 can be minimized in length, whereby the generation of parasitic inductance and the like associated with the connection wiring for the metal resistor portions 17 can be suppressed. In addition, the metal resistor portions 17 can be formed, as pad portions for the bumps 22 connecting the thin-film capacitor portion 1 and the semiconductor integrated circuit 2, on the first supply portions (11V, 11G) of the first electrode layer 11 of the thin-film capacitor portion 1, using a thin-film formation technology such as sputtering. Accordingly, the formation of the metal resistor portions 17 can be performed using a similar method to the method for the thin-film capacitor portion 1. That is, the formation of the metal resistor portions 17 can be performed easily.

Second Embodiment

A second embodiment will be described with reference to FIG. 10 to FIG. 12. In the following embodiment, components similar to those of the first embodiment are designated with similar reference symbols, and their description is omitted. The following embodiment differs from the first embodiment only in the position of the metal resistor portions 17. Accordingly, only the difference will be described.

Figure 10:
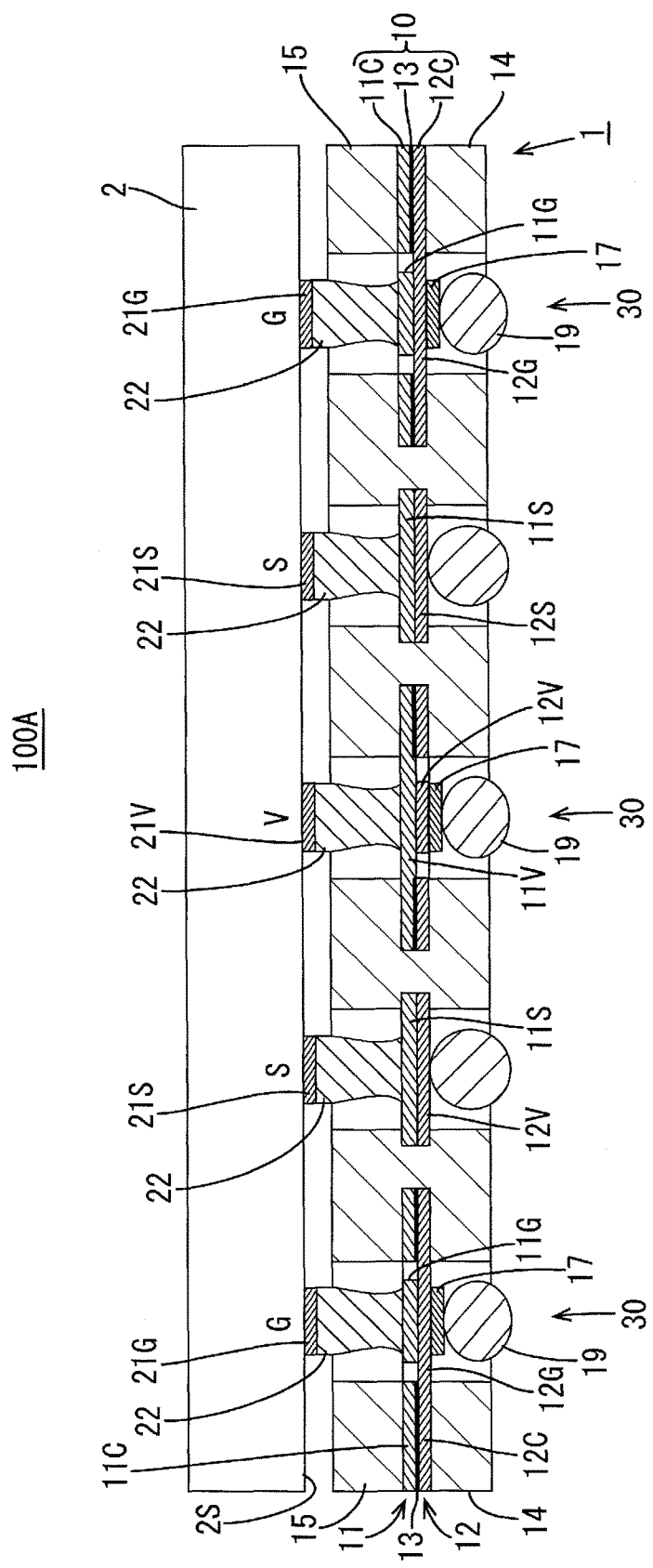
FIG. 10 is a schematic cross sectional view of a semiconductor device according to a second embodiment.
Figure 11:
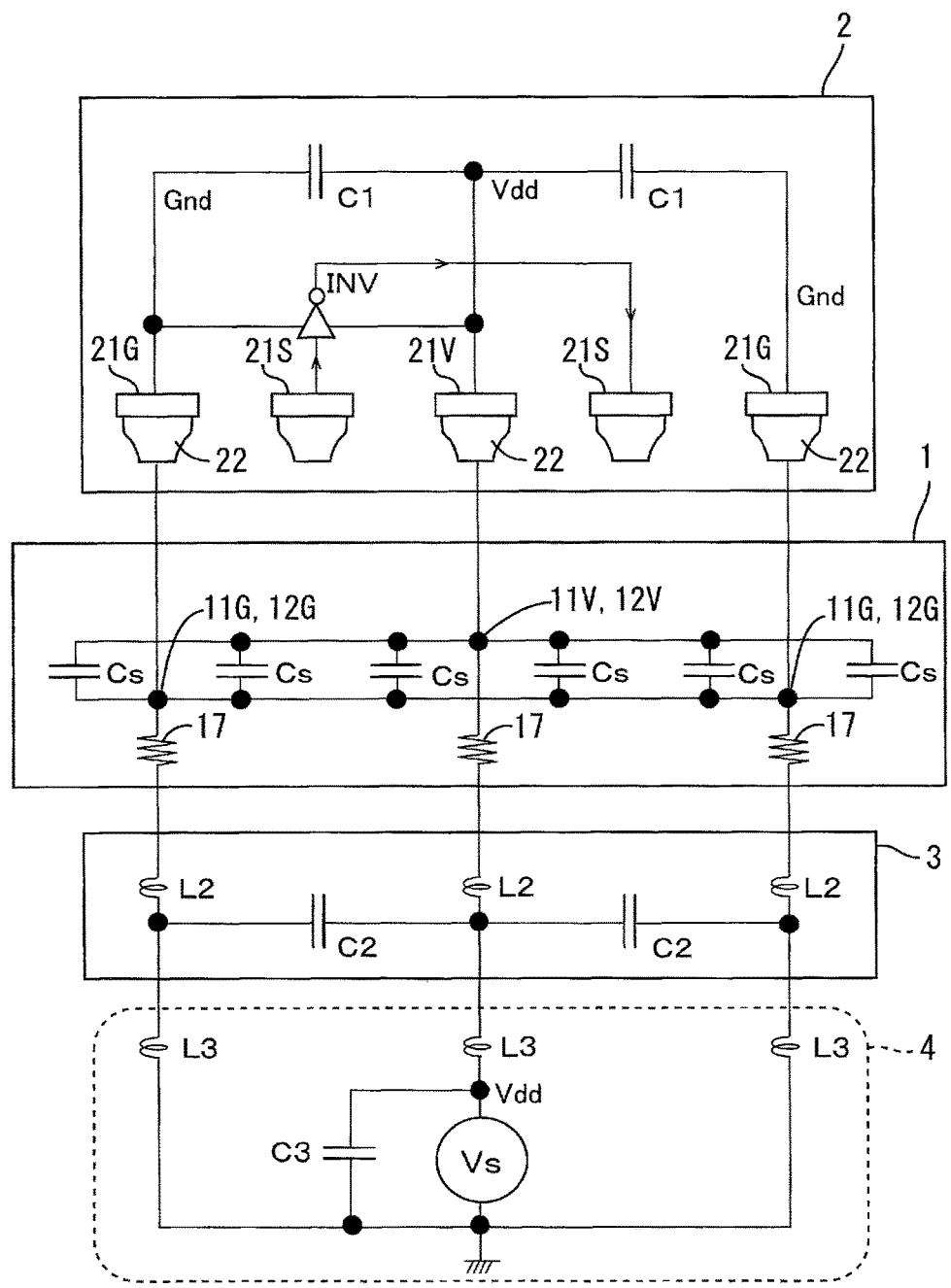
FIG. 11 is a schematic equivalent circuit diagram of a power supply system for the semiconductor device according to the second embodiment.

In a semiconductor device 100A according to the second embodiment, as illustrated in FIG. 10 and FIG. 11, the metal resistor portions 17 are provided in the electric power supply paths 30 between the external connection bumps (an example of "external connection portion") 19 and the second supply portions (12G, 12V) of the second electrode layer 12. Specifically, the metal resistor portions 17 are provided between the power supply voltage electrode pads (an example of "second supply portion") 12V and the external connection bumps 19, and between the ground electrode pads (an example of "second supply portion") 12G and the external connection bumps 19.

The external connection portions are not limited to the external connection bumps 19. For example, when the semiconductor device 100A is provided with an intermediate board under the thin-film capacitor portion 1 for expanding the electrode pitch of the LSI chip 2, the external connection portions may include connection pads provided on the intermediate board for connecting the thin-film capacitor portion 1 and the intermediate board.

Figure 12A:
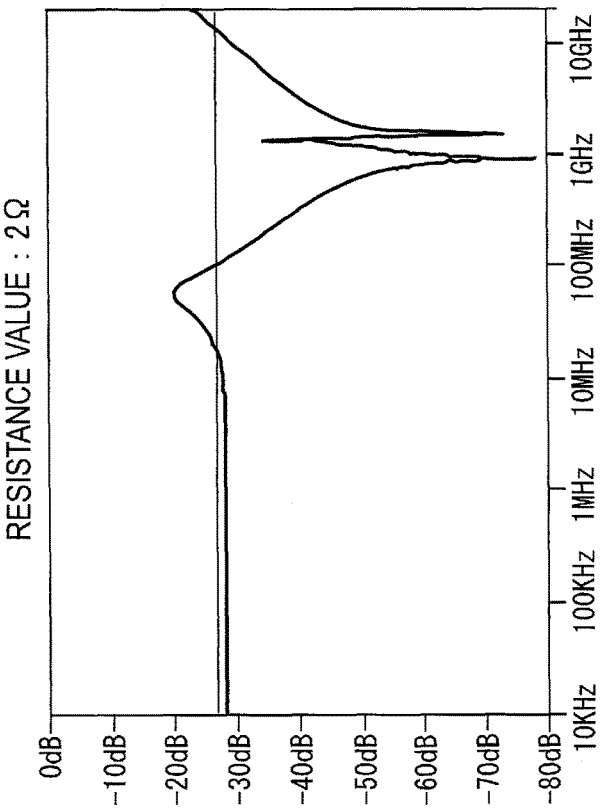
FIGS. 12A and 12B are graphs of power supply impedance characteristics depending on the resistance value of a metal resistor portion.
Figure 12B:
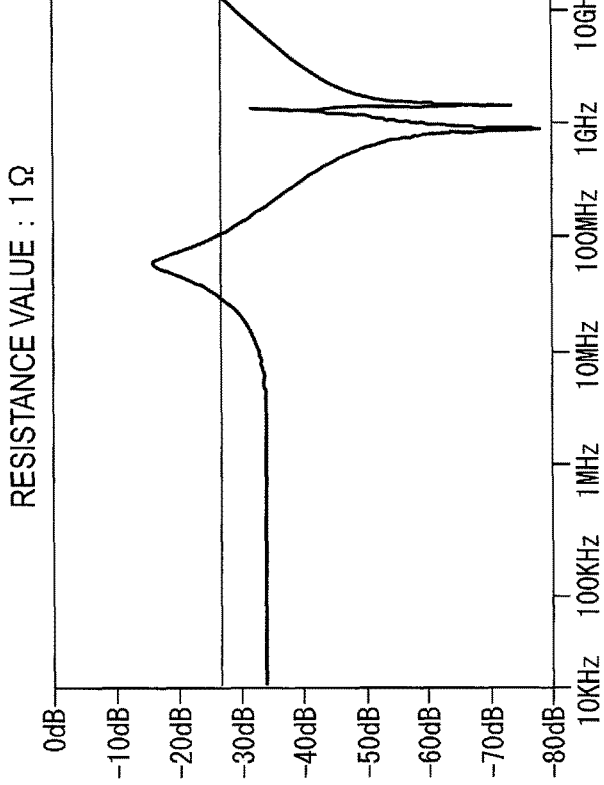
Figure 13:
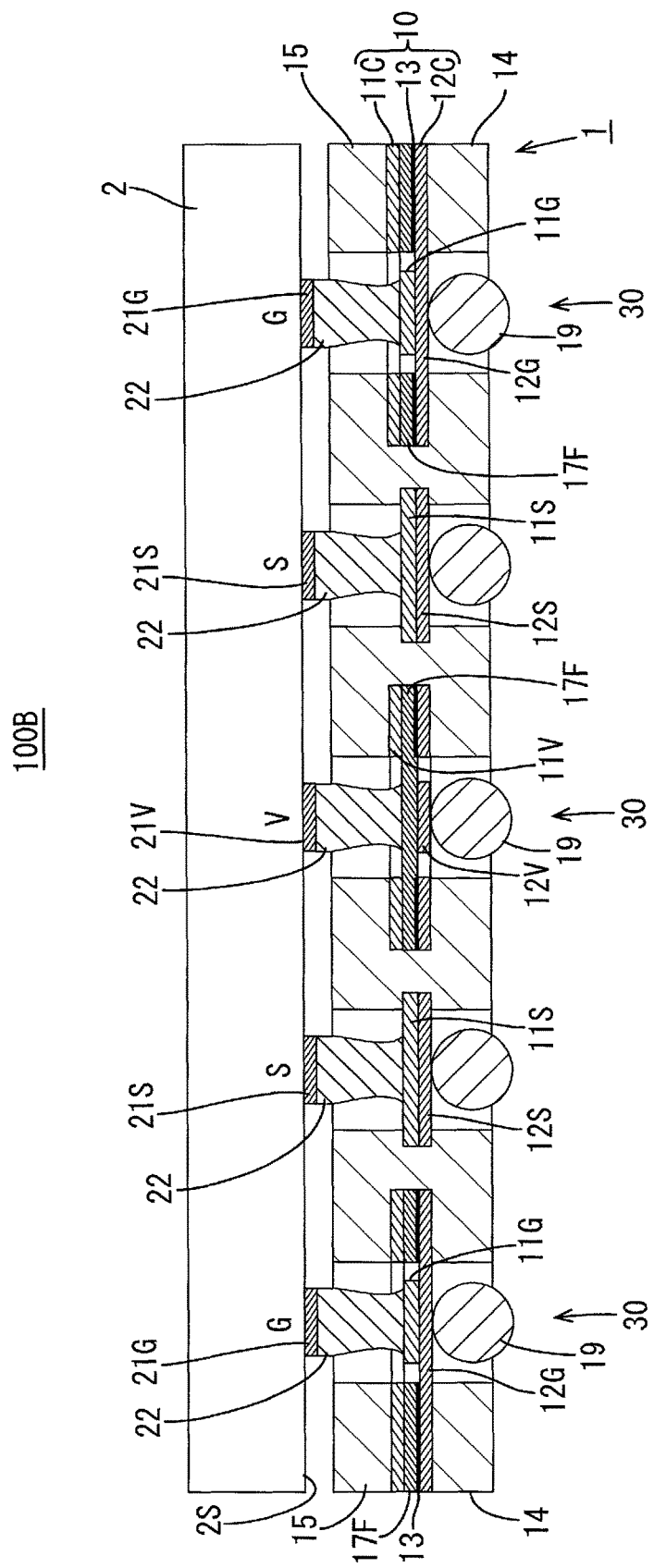
FIG. 13 is a schematic cross sectional view of a semiconductor device according to a third embodiment.

Results of a simulation of the power supply impedance in the second embodiment are illustrated in FIGS. 12A and 12B. As in the first embodiment, the peak of an antiresonance point exhibited at around 60 MHz decreases as the resistance value of the metal resistor portions 17 increases, and, correspondingly, the power supply impedance Zs at 10 MHz or below increases. In the configuration of the second embodiment, the peak of an antiresonance point exhibited at around 1.3 GHz is not much decreased.

5. Effects of Second Embodiment

As illustrated in FIGS. 12A and 12B, it has been confirmed through the simulation that the power supply impedance Zs can be decreased by means of the metal resistor portions 17.

The metal resistor portions 17 are provided between the external connection bumps 19 and the thin-film capacitor portion 1 or, specifically, between the external connection bumps 19 and the second supply portions (12G, 12V). Accordingly, the electric power supply paths 30 can be formed so as to be short, and the connection wiring for the metal resistor portions 17 can be made short, whereby the generation of parasitic inductance and the like associated with the connection wiring for the metal resistor portions 17 can be suppressed. In addition, the metal resistor portions 17 can be formed on the second supply portions (12G, 12V) of the second electrode layer of the thin-film capacitor portion 1, using a thin-film formation technology such as sputtering.

Third Embodiment

Figure 14:
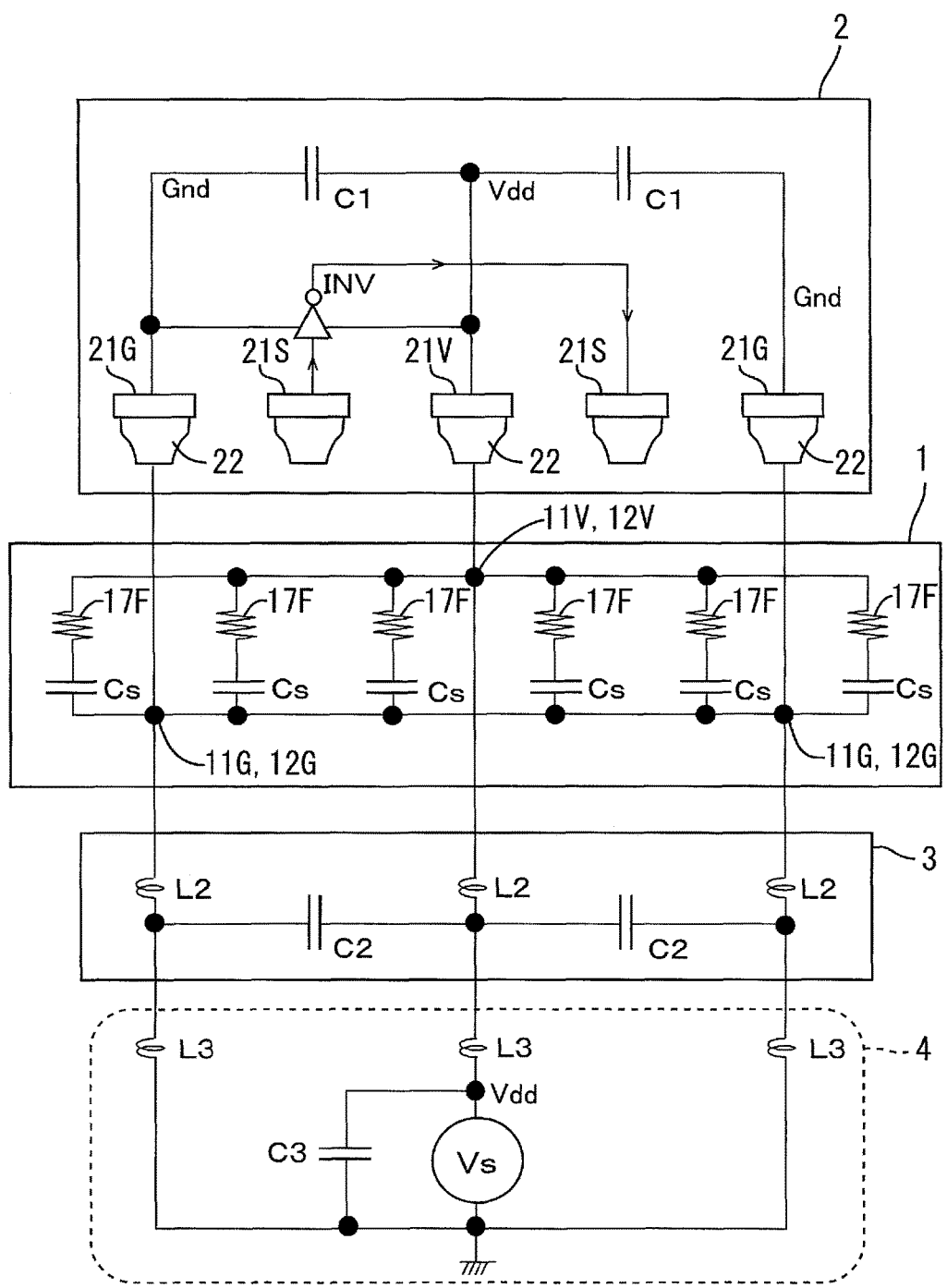
FIG. 14 is a schematic equivalent circuit diagram of a power supply system for the semiconductor device according to the third embodiment.

A third embodiment will be described with reference to FIG. 13 to FIG. 16. In a semiconductor device 100B according to the third embodiment, resistors corresponding to the metal resistor portions 17 are made of a metal resistor layer 17F provided, as illustrated in FIG. 14, at a position of being connected in series with the thin-film capacitor 10 (Cs). Specifically, the metal resistor layer 17F, as illustrated in FIG. 16, is formed, in the thin-film capacitor portion 1, on the dielectric layer 13, which is the third layer, by sputtering a high-resistance metal oxide, for example (see FIG. 16D). The metal resistor layer 17F has a film thickness of 0.01 μm to 20 μm. As illustrated in FIGS. 16C and 16D, the planar shape of the dielectric layer 13 is identical with the planar shape of the metal resistor layer 17F. According to the third embodiment, the first electrode layer 11 is formed as the fifth layer on the metal resistor layer 17F.

Figure 15A:
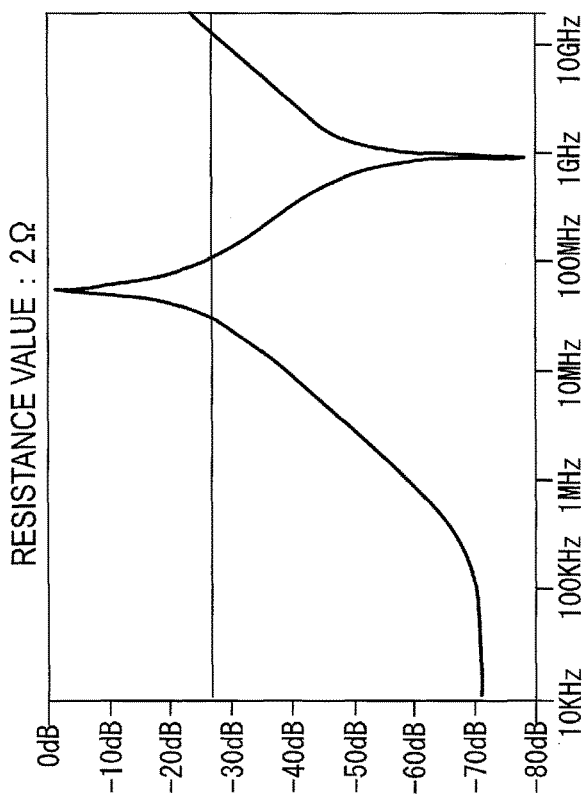
FIGS. 15A and 15B are graphs of power supply impedance characteristics depending on the resistance value of the metal resistor portion.
Figure 15B:
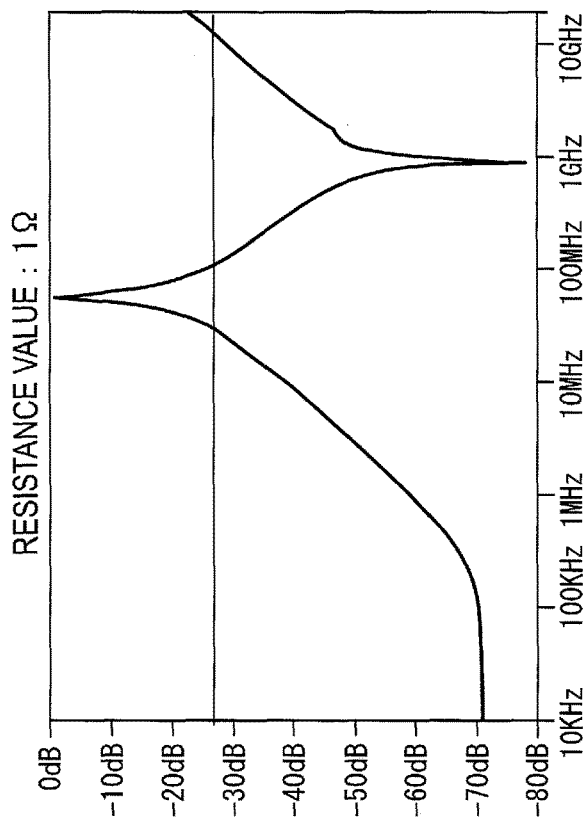

Results of a simulation of the power supply impedance Zs in this case are illustrated in FIGS. 15A and 15B. It has been confirmed that, compared with FIG. 7, as the resistance value of the metal resistor portions 17 increases, the region in the high-frequency region of 10 GHz or above in which the power supply impedance Zs is not more than 1Ω is extended.

6. Effects of Third Embodiment

It has been confirmed through the simulation that, by means of the metal resistor layer 17F, the region in the high-frequency region of 10 GHz or above in which the power supply impedance Zs is not more than 1Ω is extended, that is, that the power supply impedance is decreased.

It can also be said that the resistors (metal resistor layer 17F) connected in series with the thin-film capacitor 10 are formed without connection wiring. In addition, the metal resistor layer 17F can be formed using the thin-film formation technology for forming the thin-film capacitor 10, such as sputtering.

Fourth Embodiment

Figure 17:
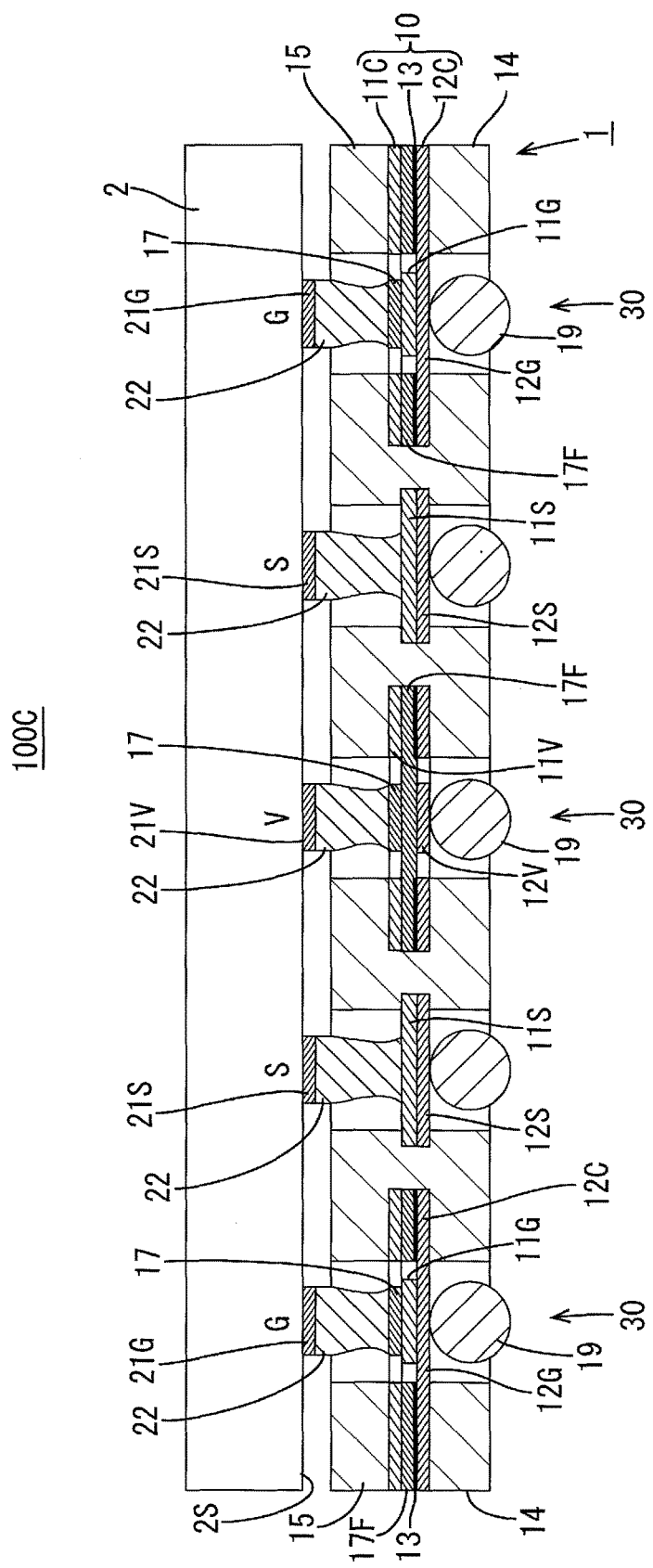
FIG. 17 is a schematic cross sectional view of a semiconductor device according to a fourth embodiment.
Figure 18:
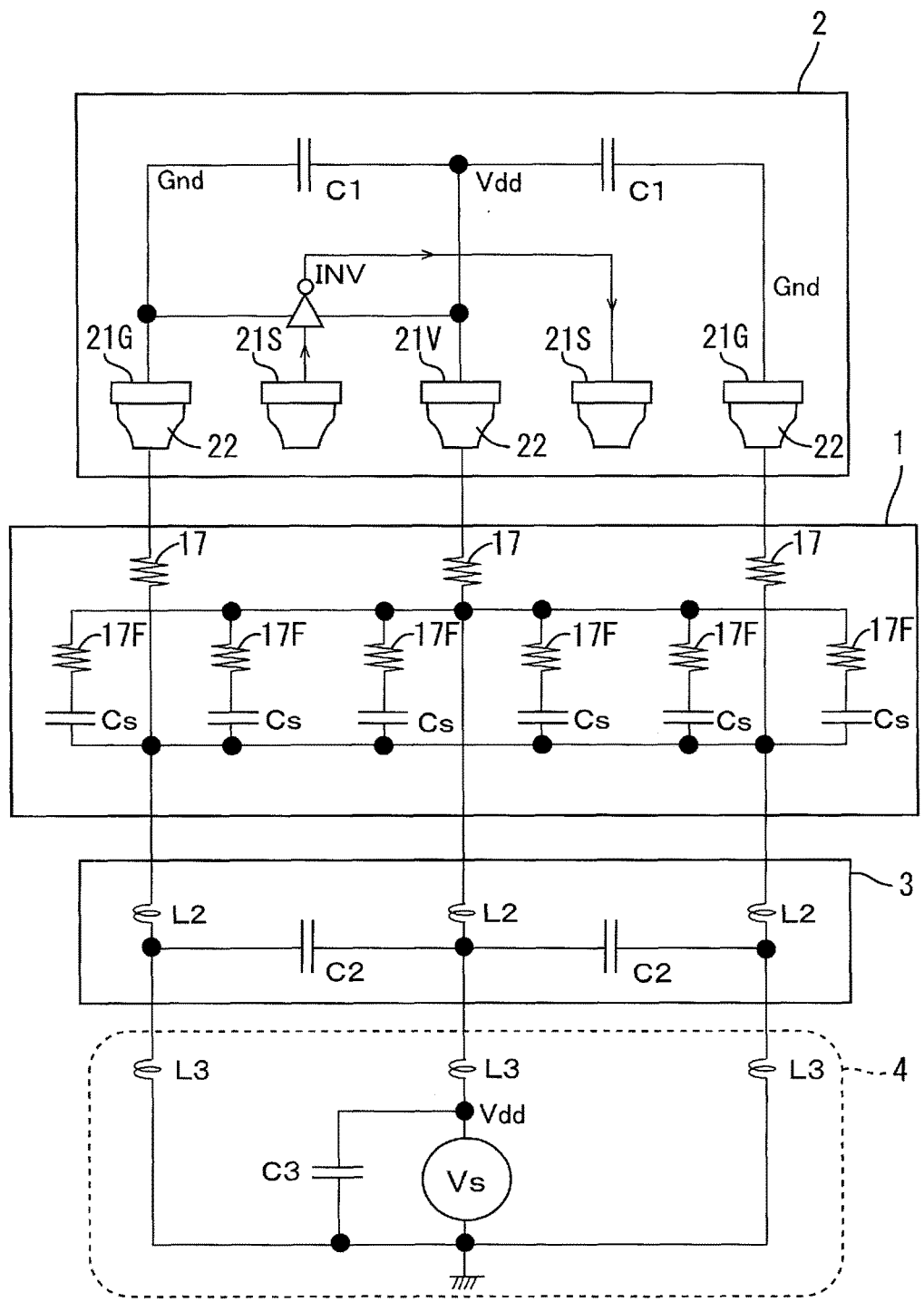
FIG. 18 is a schematic equivalent circuit diagram of a power supply system for the semiconductor device according to the fourth embodiment.
Figure 19:
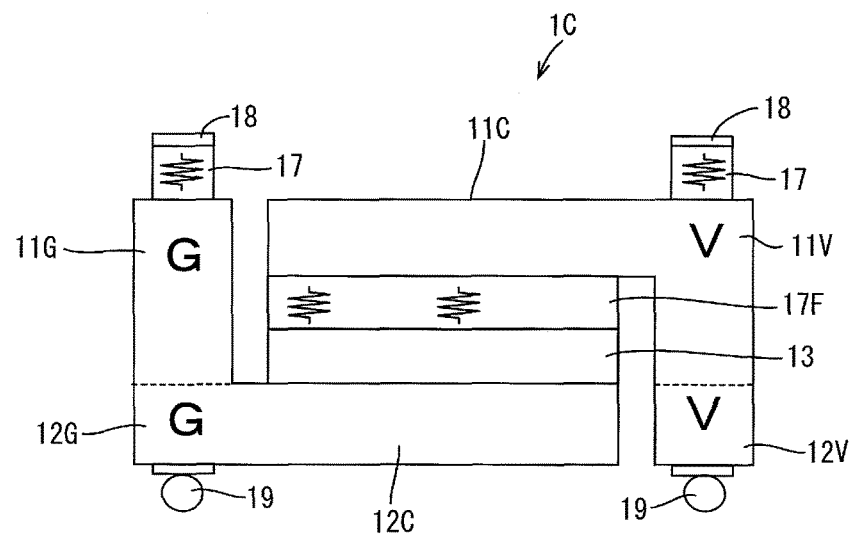
FIG. 19 is a diagram schematically illustrating the configuration of a thin-film capacitor portion according to the fourth embodiment.

A fourth embodiment will be described with reference to FIG. 17 to FIG. 20. FIG. 19 is a schematic, enlarged view illustrating the configuration of a thin-film capacitor portion 1C according to the fourth embodiment.

Figure 20:
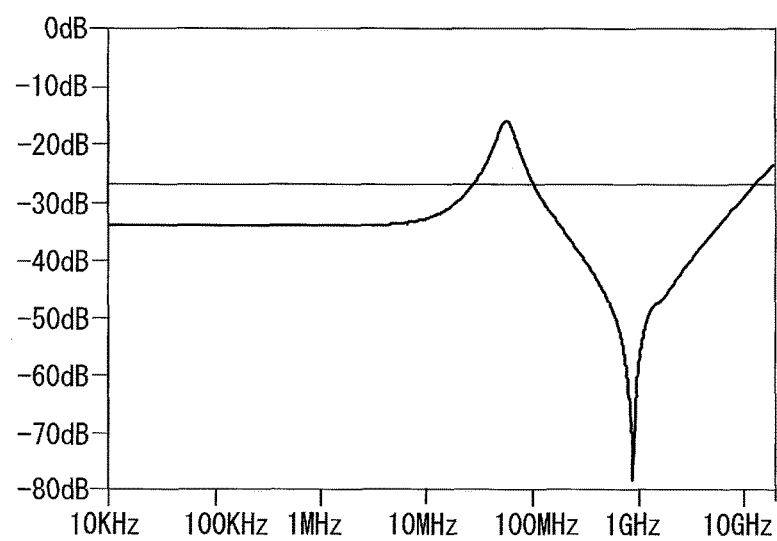
FIG. 20 is a graph of power supply impedance characteristics according to the fourth embodiment.

In the semiconductor device 100C according to the fourth embodiment, the annular (thin plate-like) metal resistor portions 17 according to the first embodiment are combined with the metal resistor layer 17F according to the third embodiment. That is, in the fourth embodiment, as illustrated in FIG. 17 and FIG. 18, both the metal resistor portions 17 and the metal resistor layer 17F are provided, of which the resistance values are each 1Ω. Results of a simulation of the power supply impedance Zs in this case are illustrated in FIG. 20. It can be confirmed that, when the resistance values are 1Ω, power supply impedance characteristics similar to those according to the first embodiment when the metal resistor portions 17 have 2Ω can be obtained. That is, the peak of the antiresonance point exhibited at around 60 MHz can be decreased to a similar degree to when the metal resistor portions 17 have 2Ω, and the generation of antiresonance at around 1.3 GHz can be suppressed. In addition, the power supply impedance characteristics at 10 MHz or below are similar to those in FIG. 6A.

7. Effects of Fourth Embodiment

It can be said that by means of the metal resistor layer 17F, the resistors connected in series with the thin-film capacitor 10 can be formed without connection wiring. It has also been confirmed that, by adding the metal resistor layer 17F to the metal resistor portions 17 formed in the electric power supply paths 30, the power supply impedance decreasing effect by the metal resistor portions 17 alone is reinforced. In addition, the resistors (metal resistor layer 17F) connected in series with the thin-film capacitor 10 can be formed using the thin-film formation technology for forming the thin-film capacitor 10, such as sputtering.

Other Embodiments

The present invention is not limited to the embodiments described in the above description and the drawings, and may include the following embodiments in the technical scope of the present invention.

(1) In the first embodiment, the metal resistor portions 17, when provided between the bump mounting surface 2S of the semiconductor integrated circuit 2 and the thin-film capacitor portion 1, are provided between the bumps 22 and an first supply portions (11G, 11V) of the first electrode layer 11 byway of example. However, this is not a limitation. For example, the metal resistor portions 17 may be provided between the bumps 22 and the second supply portions (12G, 12V) of the second electrode layer 12. That is, the metal resistor portions 17, when provided between the bump mounting surface 2S of the semiconductor integrated circuit 2 and the thin-film capacitor portion 1, may be provided at least one of between the bumps 22 and the first supply portions (11G, 11V), and between the bumps 22 and the second supply portions (12G, 12V).

In the first embodiment, the metal resistor portions 17 may be provided at only one of the first supply portions (11G, 11V) of the first electrode layer 11. That is, the number of the metal resistor portions 17 provided in the electric power supply paths 30 may be determined as needed.

(2) In the first embodiment, further, the metal resistor portions 17, when provided between the bump mounting surface 2S of the semiconductor integrated circuit 2 and the thin-film capacitor portion 1, may be provided at the power supply pads (first power supply pads) 21V and the ground pads (second power supply pads) 21G on the LSI chip 2. In this case, also, the electric power supply paths 30 can be formed so as to be short, and the connection wiring for the metal resistor portions 17 can be minimized in length, whereby the generation of parasitic inductance and the like associated with the connection wiring for the metal resistor portions 17 can be suppressed. That is, the power supply impedance can be decreased while suppressing the generation of noise at the time of high speed operation of the LSI chip 2.

(3) In the second embodiment, the metal resistor portions 17, when provided between the external connection bumps 19 and the thin-film capacitor portion 1, are provided between the external connection bumps 19 and the first supply portions (12G, 12V) of the second electrode layer 12 by way of example. However, this is not a limitation. For example, the metal resistor portions 17 may be provided between the external connection bumps 19 and the first supply portions (11G, 11V) of the first electrode layer 11. That is, the metal resistor portions 17, when provided between the external connection bumps 19 and the thin-film capacitor portion 1, may be provided at least one of between the external connection bumps 19 and the first supply portions (11G, 11V), and between the external connection bumps 19 and the second supply portions (12G, 12V).

In the second embodiment, the metal resistor portions 17 may be provided at only one of the second supply portions (12G, 12V) of the second electrode layer 12. That is, the number of the metal resistor portions 17 provided in the electric power supply paths 30 may be determined as needed. In addition, the second embodiment may be further provided with the metal resistor layer 17F according to the fourth embodiment.

(4) In the third embodiment and the fourth embodiment, the metal resistor layer 17F is formed on the dielectric layer 13, i.e., between the first electrode layer 11 and the dielectric layer 13 by way of example. However, this is not a limitation. The metal resistor layer 17F may be formed on the second electrode layer 12, i.e., between the second electrode layer 12 and the dielectric layer 13.

(5) In the foregoing embodiments, the configuration of the semiconductor device 100 includes the thin-film capacitor portion 1 and the LSI chip 2. However, this is not a limitation, and the semiconductor device 100 may be provided with an intermediate board under the thin-film capacitor portion 1 for extending the electrode pitch of the LSI chip 2.

(6) In the foregoing embodiments, the configuration of the semiconductor device 100 includes the thin-film capacitor portion 1 and the LSI chip 2. However, this is not a limitation, and for example, the semiconductor device 100 may be provided with an intermediate board under the thin-film capacitor portion 1 for expanding the electrode pitch of the LSI chip 2 or, in other words, the pitch of the bumps 22.

(7) In the foregoing embodiments, the thin-film capacitor portion 1 has the same planar shape as the planar shape of the LSI chip 2 by way of example. However, this is not a limitation, and the planar shape of the thin-film capacitor portion 1 may be larger than the planar shape of the LSI chip 2.

(8) In the foregoing embodiments, the first electrode layer 11 is the electrode to which the positive power supply voltage is applied, while the second electrode layer 12 is the electrode to which the negative power supply voltage (ground voltage) is applied. However, this is not a limitation, and the reverse may be the case. That is, the first electrode layer 11 may be the electrode to which the ground voltage is applied while the second electrode layer 12 may be the electrode to which the positive power supply voltage is applied.

EXPLANATION OF SYMBOLS

1: Thin-film capacitor portion
2: LSI chip (Semiconductor integrated circuit)
2S: Bump mounting surface
10: Thin-film capacitor
11: First electrode layer
11G, 11V: First supply portion
12: Second electrode layer
12G, 12V: Second supply portion
13: Dielectric layer
17: Metal resistor portion
17F: Metal resistor layer
19: Micro solder ball
22: Bump
21G: Ground pad (Second power supply pad)
21V: Power supply pad (First power supply pad)
30: Electric power supply path
100: Semiconductor device

The invention claimed is:

1. A semiconductor device comprising:
a semiconductor integrated circuit having a bump mounting surface; and
a thin-film capacitor portion connected to the bump mounting surface via a bump,
wherein:
the semiconductor integrated circuit includes
a first power supply pad formed on the bump mounting surface and to which a power supply voltage of one polarity is applied, and
a second power supply pad formed on the bump mounting surface and to which a power supply voltage of another polarity is applied; and
the thin-film capacitor portion includes
a first electrode layer connected to the first power supply pads via the bump,
a second electrode layer connected to the second power supply pads via the bump, and
a dielectric layer formed between the first electrode layer and the second electrode layer,
the semiconductor device comprising
an electric power supply path configured to supply electric power to the semiconductor integrated circuit, and
a thin plate-shaped metal resistor portion provided in the electric power supply path and made from a metal based high-resistance material having a volume resistivity higher than a volume resistivity of the first electrode layer and the second electrode layer.

2. The semiconductor device according to claim 1, wherein:
the electric power supply path includes the first and second power supply pads, the bump, and the thin-film capacitor portion; and
the metal resistor portion is provided between the bump mounting surface of the semiconductor integrated circuit and the thin-film capacitor portion.

3. The semiconductor device according to claim 2, wherein:
the first electrode layer includes a first supply portion constituting the electric power supply path and electrically connected to the bump;
the second electrode layer includes a second supply portion constituting the electric power supply path and electrically connected to the bump; and
the metal resistor portion is provided at least one of between the bump and the first supply portion, and between the bump and the second supply portion.

4. The semiconductor device according to claim 2, wherein the metal resistor portion is provided at the first power supply pad and the second power supply pad.

5. The semiconductor device according to claim 1, further comprising an external connection portion configured to electrically connect, on an opposite side from the semiconductor integrated circuit, the thin-film capacitor portion to an outside,
wherein:
the electric power supply path includes the first and second power supply pads, the bump, the thin-film capacitor portion, and the external connection portion; and
the metal resistor portion is provided between the external connection portion and the thin-film capacitor portion.

6. The semiconductor device according to claim 5, wherein:
the first electrode layer includes a first supply portion constituting the electric power supply path and electrically connected to the bump;
the second electrode layer includes a second supply portion constituting the electric power supply path and electrically connected to the bump; and
the metal resistor portion is provided is provided at least one of between the external connection portion and the first supply portion, and between the external connection portion and the second supply portion.

7. The semiconductor device according to claim 1, wherein the metal resistor portion has a volume resistivity of not smaller than 70 $\mu\Omega\cdot$cm.

8. The semiconductor device according to claim 1, wherein the thin-film capacitor portion includes a metal resistor layer formed between the first electrode layer and the dielectric layer, or between the second electrode layer and the dielectric layer, and made from a metal based high-resistance material having a volume resistivity higher than a volume resistivity of the first electrode layer and the second electrode layer.

9. The semiconductor device according to claim 8, wherein the metal resistor layer has a volume resistivity of not smaller than 70 $\mu\Omega\cdot$cm.

10. The semiconductor device according to claim 1, wherein the thin-film capacitor portion has a planar shape equal to a planar shape of the semiconductor integrated circuit.

11. A semiconductor device comprising:
a semiconductor integrated circuit having a bump mounting surface; and
a thin-film capacitor portion connected to the bump mounting surface via a bump,
wherein:
the semiconductor integrated circuit includes
a first power supply pad formed on the bump mounting surface and to which a power supply voltage of one polarity is applied, and
a second power supply pad formed on the bump mounting surface and to which a power supply voltage of another polarity is applied; and the thin-film capacitor portion includes
a first electrode layer connected to the first power supply pad via the bump,
a second electrode layer connected to the second power supply pad via the bump,
a dielectric layer formed between the first electrode layer and the second electrode layer, and
a metal resistor layer formed between the first electrode layer and the dielectric layer, or between the second electrode layer and the dielectric layer, and made from a metal based high-resistance material having a volume resistivity higher than a volume resistivity of the first electrode layer and the second electrode layer.

12. The semiconductor device according to claim 11, wherein the metal resistor layer has a volume resistivity of not smaller than 70 µΩ·cm.

* * * * *